US012563709B2

(12) United States Patent
Jung

(10) Patent No.: US 12,563,709 B2
(45) Date of Patent: Feb. 24, 2026

(54) ELECTRONIC APPARATUS INCLUDING SHIELDING MEMBER

(71) Applicant: SAMSUNG ELECTRONICS CO., LTD., Suwon-si (KR)

(72) Inventor: Yanggyun Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 163 days.

(21) Appl. No.: 18/379,639

(22) Filed: Oct. 12, 2023

(65) Prior Publication Data

US 2024/0040757 A1      Feb. 1, 2024

Related U.S. Application Data

(63) Continuation of application No. PCT/KR2022/006931, filed on May 13, 2022.

(30) Foreign Application Priority Data

May 25, 2021      (KR) ......................... 10-2021-0066598

(51) Int. Cl.
| | |
|---|---|
| *H05K 5/00* | (2025.01) |
| *H05K 9/00* | (2006.01) |
| *H04R 1/02* | (2006.01) |

(52) U.S. Cl.
CPC ........... *H05K 9/002* (2013.01); *H05K 5/0018* (2022.08); *H04R 1/025* (2013.01)

(58) Field of Classification Search
CPC ....... H05K 9/002; H05K 5/0018; H04R 1/025
USPC ................................................. 361/816, 818
See application file for complete search history.

(56) References Cited

U.S. PATENT DOCUMENTS

| | | | | |
|---|---|---|---|---|
| 5,761,053 A | * | 6/1998 | King ..................... | H01L 23/552 |
| | | | | 361/752 |
| 2006/0104469 A1 | * | 5/2006 | Hawker ................. | H04R 1/083 |
| | | | | 381/361 |
| 2010/0304796 A1 | | 12/2010 | Stohr et al. | |
| 2014/0369533 A1 | | 12/2014 | Kim et al. | |

(Continued)

FOREIGN PATENT DOCUMENTS

| | | |
|---|---|---|
| CN | 210168201 U | 3/2020 |
| CN | 112788166 A | 5/2021 |

(Continued)

OTHER PUBLICATIONS

International Search Report and Written Opinion for International Application No. PCT/KR2022/006931; International Filing Date May 13, 2022; Date of Mailing Aug. 23, 2022; 10 Pages.

(Continued)

*Primary Examiner* — Hung S. Bui
(74) *Attorney, Agent, or Firm* — CANTOR COLBURN LLP

(57)      ABSTRACT

An electronic apparatus includes a housing, a display module, an acoustic component which is located inside the housing and includes a magnetic material, and a shielding member located between the display module and the acoustic component. The shielding member includes a first portion which is located adjacent to the acoustic component, and a second portion which is located adjacent to the display module and bends and extends from one side of the first portion.

17 Claims, 12 Drawing Sheets

(56)        References Cited

U.S. PATENT DOCUMENTS

| | | |
|---|---|---|
| 2016/0073182 A1 | 3/2016 | Kole et al. |
| 2016/0073558 A1 | 3/2016 | Kole et al. |
| 2018/0035188 A1 | 2/2018 | Lim et al. |
| 2018/0070482 A1 | 3/2018 | Choi et al. |
| 2019/0082563 A1 | 3/2019 | Wah et al. |
| 2020/0169816 A1 | 5/2020 | Kim et al. |
| 2020/0404426 A1 | 12/2020 | Lei |
| 2021/0034119 A1 | 2/2021 | Yoon et al. |
| 2022/0070577 A1 | 3/2022 | Liu et al. |

FOREIGN PATENT DOCUMENTS

| | | |
|---|---|---|
| EP | 2416544 A1 | 2/2012 |
| JP | 2014523588 A | 9/2014 |
| KR | 20140145068 A | 12/2014 |
| KR | 20160122388 A | 10/2016 |
| KR | 20180013403 A | 2/2018 |
| KR | 20180027964 A | 3/2018 |
| KR | 20200060991 A | 6/2020 |
| KR | 20210015149 A | 2/2021 |
| KR | 20210103528 A | 8/2021 |
| KR | 102497962 B1 | 2/2023 |

OTHER PUBLICATIONS

Korean Examination Report corresponding to Application No. 10-2021-0066598; Dated Oct. 13, 2025.

* cited by examiner

ELECTRONIC APPARATUS INCLUDING SHIELDING MEMBER

CROSS-REFERENCE TO RELATED APPLICATIONS

This application is a continuation of International Application No. PCT/KR2022/006931 filed on May 13, 2022, designating the United States, in the Korean Intellectual Property Receiving Office, and claiming priority to Korean Patent Application No. 10-2021-0066598 filed on May 25, 2021, the disclosures of which are all hereby incorporated by reference herein in their entireties.

BACKGROUND

1. Technical Field

Various embodiments of the disclosure relate to a shielding member for shielding magnetic force generated from a component and an electronic device including the same.

2. Description of Related Art

Advancing information communication and semiconductor technologies accelerate the spread and use of various electronic devices. In particular, recent electronic devices are being developed to carry out communication while carried on.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, the electronic devices may output stored information as voices and/or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling and/or e-wallet function. These electronic devices have been downsized to be conveniently carried by users.

Electronic devices commonly implement a display module which includes a digitizer. The digitizer is typically disposed on the back of the display panel to generate an electronic signal (e.g., a magnetic field) and interacts with a digital pen (e.g., stylus pen) to identify the position of the digital pen by the detected signal. The electronic device, however, may implement additional components that generate a magnetic force which may influence the digitizer magnetic field and affect the ability to identify the position of the digital pen. To secure the performance of the digital pen for detecting the signal by magnetic force, a separate shielding member (e.g., an SPCC) may be disposed to shield the magnetic force generated from the components toward the display module.

A structure is typically provided for coupling the shielding member to the display module to shield the magnetic force generated from the other components. However, the display panel may be damaged if the shielding member is lifted or incorrectly assembled. Further, when one of the magnetic force components is an acoustic component (e.g., a speaker), sufficient acoustic performance may not be achieved due to the acoustic conduit narrowed by the shielding member.

SUMMARY

According to an embodiment of the disclosure, there may be provided an electronic device including a shielding member that provides enhanced performance without being prone to lifting away from the display or causing display damage if it is deformed.

According to an embodiment of the disclosure, it is possible to enhance the performance of the acoustic component by securing an advantageous acoustic conduit width by forming a portion of the shielding member as a conduit for the acoustic component.

According to various embodiments of the disclosure, an electronic device may comprise a housing, a display module, an acoustic component disposed in the housing and including a magnetic material, and a shielding member the display module and the acoustic component. The shielding member may include a first portion disposed adjacent to the acoustic component and a second portion bending and extending from a side of the first portion and disposed adjacent to the display module.

According to various embodiments of the disclosure, an electronic device may comprise a supporting bracket, a display module including a digitizer, an acoustic component disposed in an area of the supporting bracket and including a magnetic material, and a shielding member disposed between the display module and the acoustic component to shield a magnetic force toward the digitizer. The shielding member may include a first portion disposed adjacent to the acoustic component and a second portion bending and extending from a side of the first portion and disposed adjacent to the display module.

According to various embodiments of the disclosure, the shielding member may implement a structure in which at least a portion thereof is disposed adjacent to the acoustic component to thereby provide an advantageous structure (e.g., increases shielding efficiency) preventing the magnetic force generated from the acoustic component from being directed to the display module.

According to various embodiments of the disclosure, the shielding member may increase the width of the conduit by forming a partial shape thereof as a conduit for the acoustic component, enlarging the material and internal space to thereby save material costs.

According to various embodiments of the disclosure, the shielding member may be formed to surround the acoustic component and directly fix it to the supporting bracket for supporting the acoustic component through the adhesive member. Accordingly, waterproof performance of the acoustic component may be enhanced.

Effects of the disclosure are not limited to the foregoing, and other unmentioned effects would be apparent to one of ordinary skill in the art from the following description.

DETAILED DESCRIPTION

Figure 1:
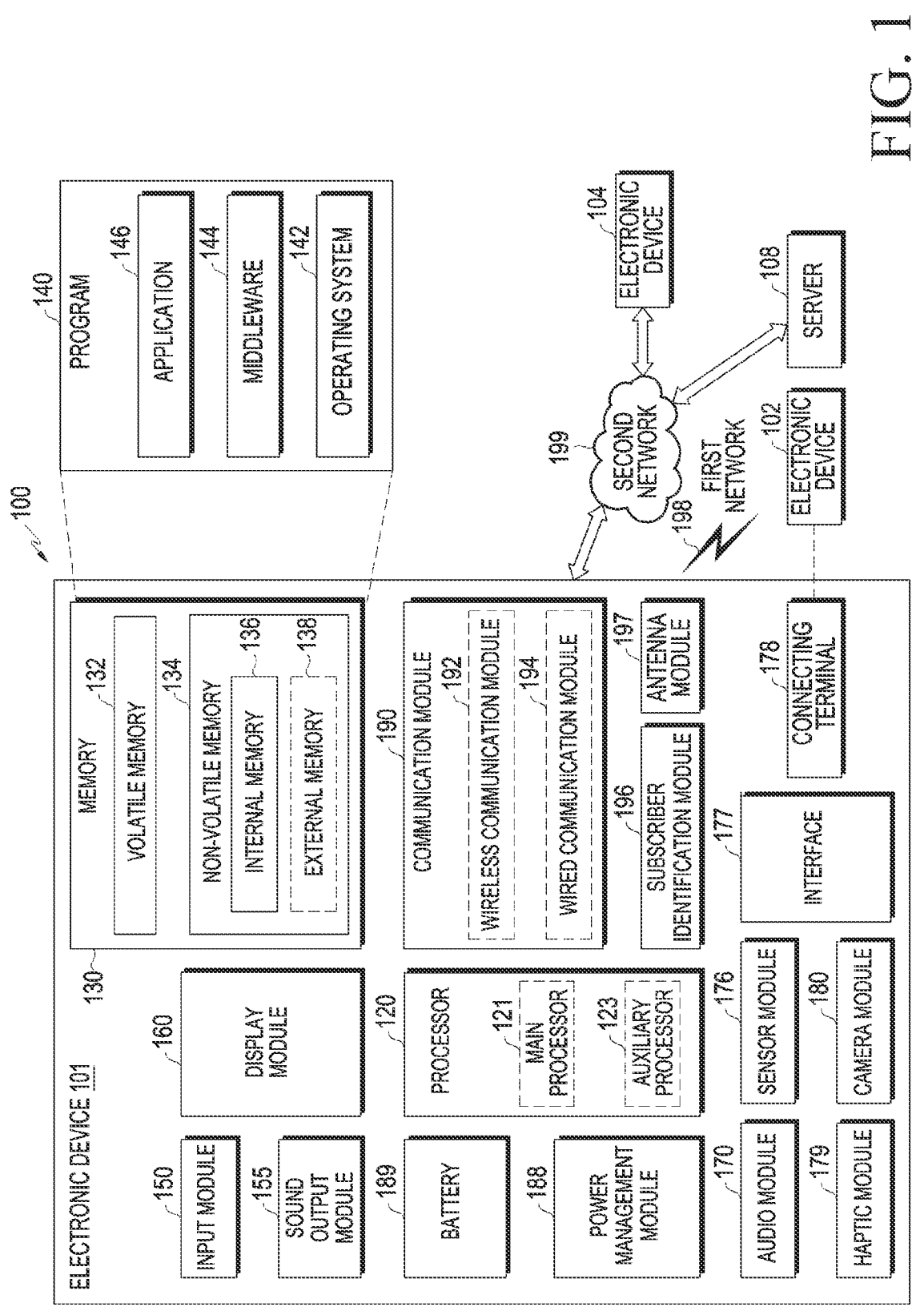
FIG. 1 is a block diagram illustrating an electronic device in a network environment according to various embodiments.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal According to an embodiment, the display module 160 may include a first display module 351 corresponding to the user's left eye and/or a second display module 353 corresponding to the user's right eye, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The storage medium readable by the machine may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
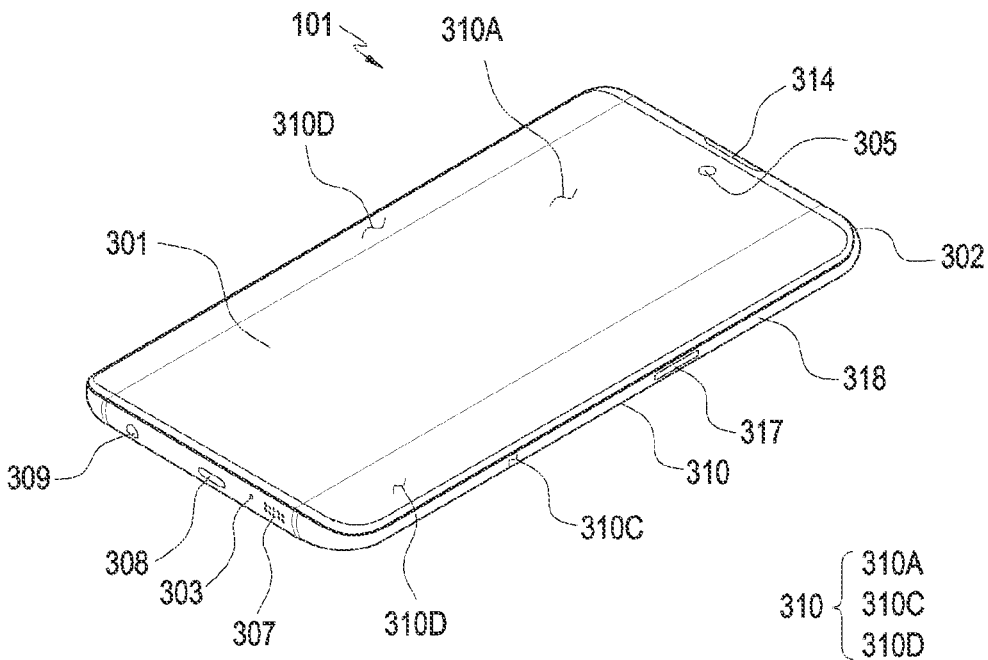
FIG. 2 is a front perspective view illustrating an electronic device according to various embodiments of the disclosure.
Figure 3:
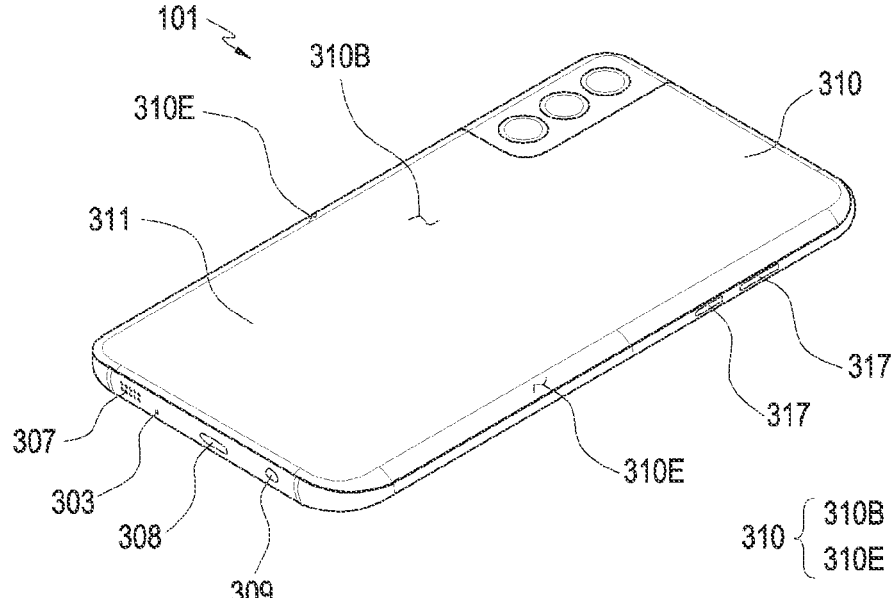
FIG. 3 is a rear perspective view illustrating an electronic device according to various embodiments of the disclosure.

FIG. 2 is a front perspective view illustrating an electronic device according to various embodiments of the disclosure; FIG. 3 is a rear perspective view illustrating an electronic device according to various embodiments of the disclosure;

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A, the rear surface 310B, and the side surface 310C of FIG. 2. According to an embodiment, at least part of the front surface 310A may have a substantially transparent front plate 302 (e.g., a glass plate or polymer plate including various coating layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge areas 310D, which seamlessly and bendingly extend from the first surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310 (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., the audio module 170 of FIG. 1), a sensor module (e.g., the sensor module of FIG. 1). 176), camera modules 305, 312, and 313 (e.g., the camera module 180 of FIG. 1), a key input device 317 (e.g., the input module 150 of FIG. 1), and connector holes 308 and 309 (e.g., the connecting terminal 178 of FIG. 1). According to an embodiment, the electronic device 101 may exclude at least one (e.g., the connector hole 309) of the components or may add other components.

According to an embodiment, the display 301 may be visually revealed through, e.g., a majority portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to an embodiment, a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to another embodiment (not shown), at least one or more of the audio module 314, sensor module (not shown), camera module 305, fingerprint sensor (not shown), and light emitting device (not shown) may be included on the rear surface of the screen display area of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E.

According to an embodiment, the audio modules 303, 307, and 314 may include, e.g., a microphone hole 303 and speaker holes 307 and 314. A microphone for acquiring external sounds may be disposed in the microphone hole 303. In some embodiments, a plurality of microphones may be disposed to detect the direction of the sound. The speaker holes 307 and 314 may include an external speaker hole 307 and a phone receiver hole 314. According to an embodiment, the speaker holes 307 and 314 and the microphone hole 303 may be implemented as a single hole, or speakers may be included without the speaker holes 307 and 314 (e.g., piezo speakers). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment, the camera modules 305, 312, and 313 may include a first camera module 305 disposed on the first surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. In an embodiment, two or more lenses (an infrared (IR) camera, a wide-angle lens, and a telephoto lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

According to an embodiment, the light emitting device may be disposed on, e.g., the front surface 310A of the housing 310. The light emitting device (not shown) may provide, e.g., information about the state of the electronic device 101 in the form of light. According to another embodiment, the light emitting device (not shown) may provide a light source that interacts with, e.g., the front camera module 305. The light emitting device (not shown) may include, e.g., a light emitting diode (LED), an infrared (IR) LED, and/or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

According to an embodiment, some 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the camera module 312 may be disposed inside the housing 310 so that the lens is exposed to the second surface 310B of the electronic device 101. For example, the camera module 312 may be disposed on a printed circuit board (e.g., the printed circuit board 340 of FIG. 4).

According to an embodiment, the camera module 305 and/or the sensor module may be disposed to contact the external environment through a transparent area from the internal space of the electronic device 101 to the front plate 302 of the display 301. Further, some sensor module 304 may be disposed to perform its functions without being visually exposed through the front plate 302 in the internal space of the electronic device.

Figure 4:
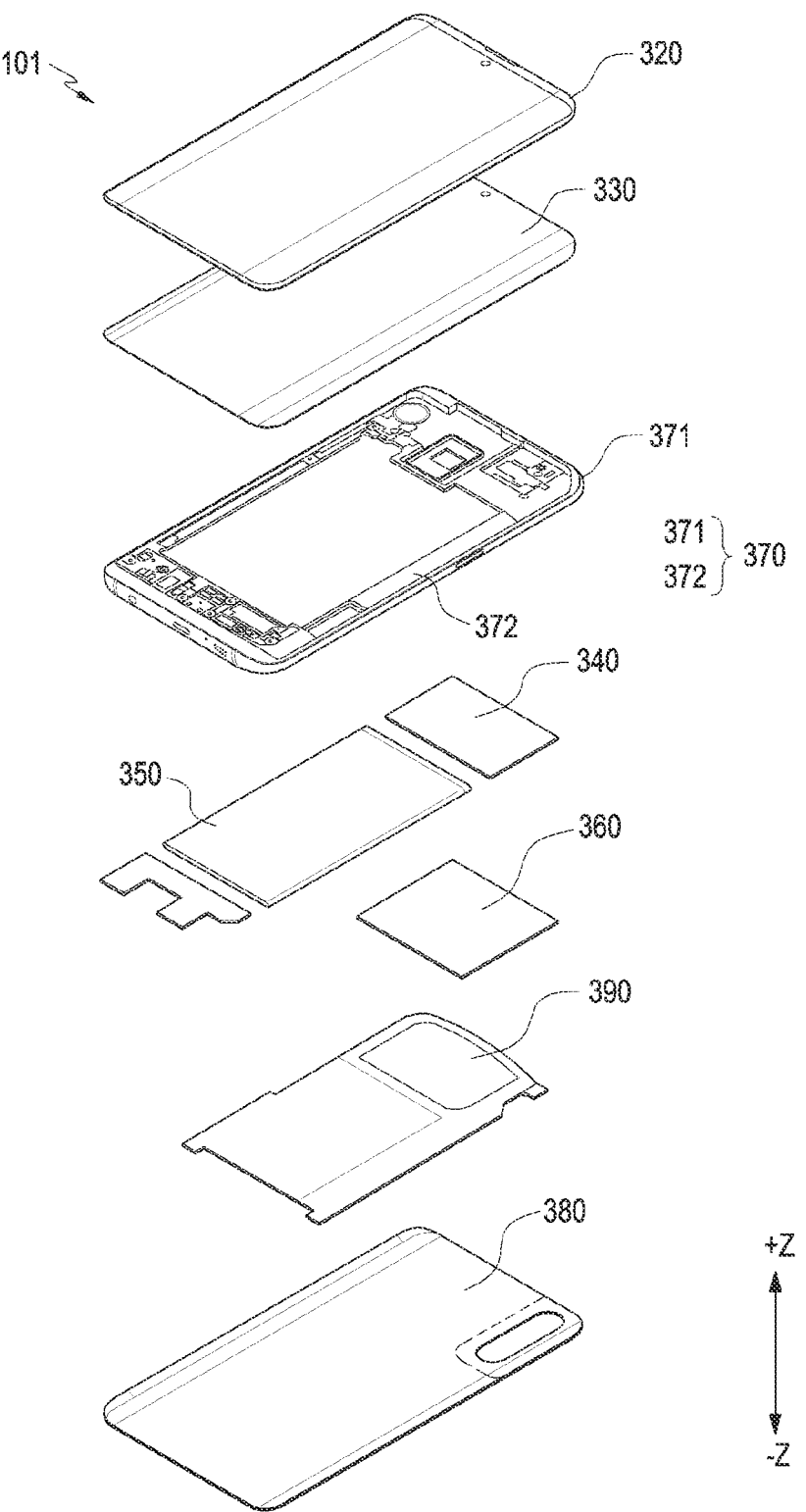
FIG. 4 is an exploded perspective view illustrating an electronic device according to various embodiments of the disclosure.

FIG. 4 is an exploded perspective view illustrating an electronic device according to various embodiments of the disclosure.

Referring to FIG. 4, according to various embodiments, an electronic device 101 (e.g., the electronic device 101 of FIGS. 1 to 3) may include a supporting bracket 370, a front plate 320 (e.g., the front plate 302 of FIG. 2), a display module 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear structure), an antenna (390) (e.g., the antenna module 197 of FIG. 1), and a rear plate 380 (e.g., the rear plate 311 of FIG. 2). The supporting bracket 370 of the electronic device 101 according to an embodiment may include a side bezel structure 371 (e.g., the side bezel structure 318 of FIG. 2) and a first supporting member 372.

According to an embodiment, the electronic device 101 may exclude at least one (e.g., the first supporting member 372 or the second supporting member 360) of the components or may add other components. At least one of the components of the electronic device 101 may be the same or similar to at least one of the components of the electronic device 101 of FIG. 2 or 3 and no duplicate description is made below.

According to various embodiments, the first supporting member 372 may be disposed inside the electronic device 101 to be connected with the side bezel structure 371 or integrated with the side bezel structure 371. The first supporting member 372 may be formed of, e.g., a metal and/or non-metallic material (e.g., polymer). The display module 330 may be joined onto one surface of the first supporting member 372, and the printed circuit board 340 may be joined onto the opposite surface of the first supporting member 311.

According to various embodiments, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 372 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 350 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear structure) may be disposed between the printed circuit board 340 and the antenna. For example, the second supporting member 360 may include one surface to which at least one of the printed circuit board 340 and the battery 350 is coupled, and another surface to which the antenna is coupled.

According to an embodiment, the antenna (not shown) may be disposed between the rear plate 380 and the battery 350. The antenna may include, e.g., a near-field communication (NFC) antenna, a wireless charging antenna, and/or a magnetic secure transmission (MST) antenna. The antenna may perform short-range communication with, e.g., an external device or may wirelessly transmit or receive power necessary for charging. According to an embodiment, an antenna structure may be formed by a portion or combination of the side bezel structure 371 and/or the first supporting member 372.

According to various embodiments, the rear plate 380 may form at least a portion of the rear surface (e.g., the second surface 310B of FIG. 3) of the electronic device 101.

Figure 5:
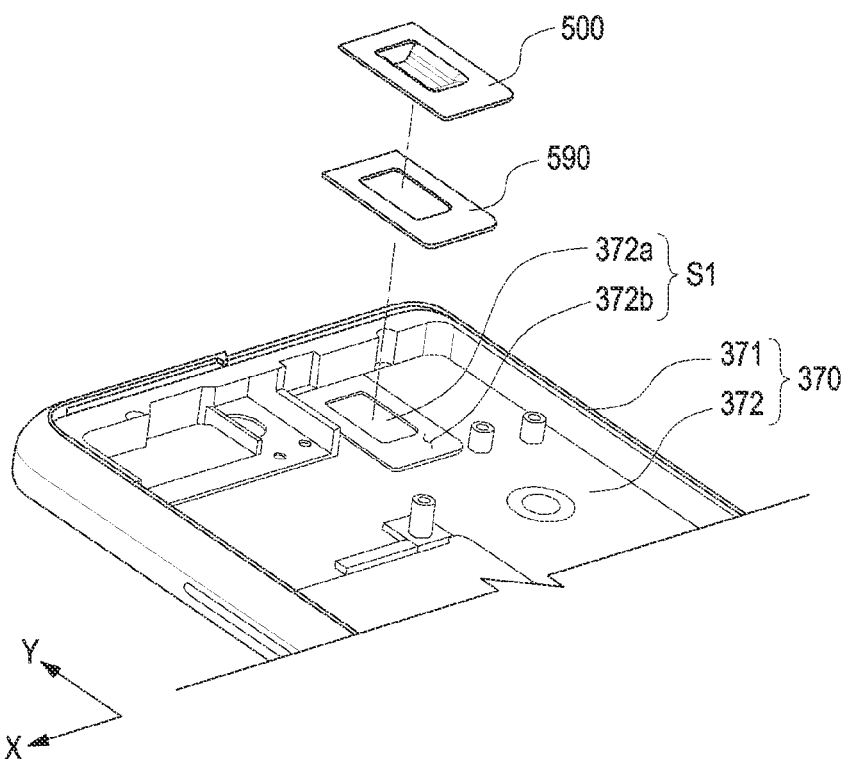
FIG. 5 is a perspective view illustrating a supporting bracket of an electronic device and a shielding member for being disposed on the supporting bracket according to one of various embodiments of the disclosure.

FIG. 5 is a perspective view illustrating a supporting bracket of an electronic device and a shielding member for being disposed on the supporting bracket according to one of various embodiments of the disclosure.

Figure 6:
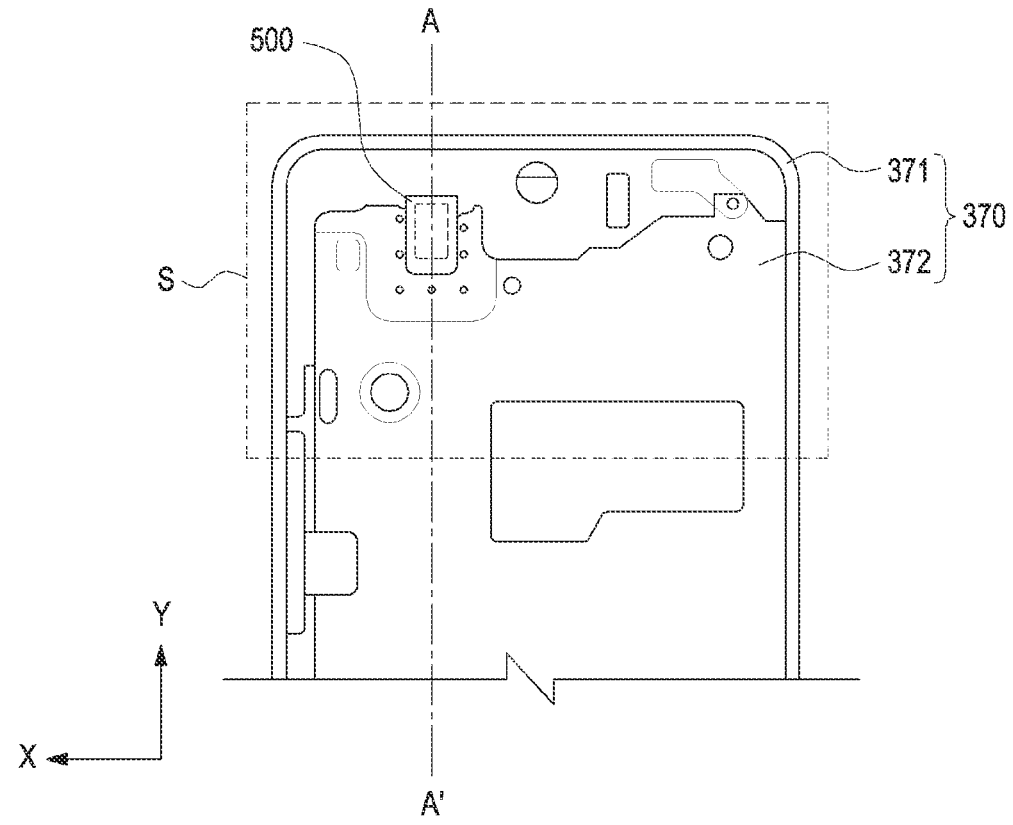
FIG. 6 is a front view illustrating a supporting bracket of an electronic device and a shielding member disposed on the supporting bracket according to one of various embodiments of the disclosure.

FIG. 6 is a front view illustrating a supporting bracket of an electronic device and a shielding member disposed on the supporting bracket according to one of various embodiments of the disclosure.

According to various embodiments, the electronic device (e.g., the electronic device 101 of FIGS. 1 to 4) may include a supporting bracket 370 and a shielding member 500 disposed in the supporting bracket 370. The supporting bracket 370 may include a side bezel structure 371 and a first supporting member 372.

The configuration of the supporting bracket 370 of FIGS. 5 and 6 may be identical in whole or part to the configuration of the supporting bracket 370 of FIG. 4.

According to various embodiments, the side bezel structure 371 forms an outer surface of the electronic device 101 and may represent a structure exposed to the outside. The first supporting member 372 may be disposed inside the electronic device 101 and connected to the side bezel structure 371. The side bezel structure 371 and the first supporting member 372 may be integrally formed.

According to various embodiments, the supporting bracket 370 may provide a space (or area) capable of receiving various components of the electronic device 101. In the upper area S of the supporting bracket 370 (see FIG. 6), components, such as a camera module (e.g., the camera module 312 of FIG. 3), an acoustic component (e.g., the sound output module 155 of FIG. 1), a circuit board (e.g., the printed circuit board 340 of FIG. 4), and a shielding member 500, may be disposed. At least some of the components may be disposed overlapping each other. The upper area S may be a portion of the electronic device 101 facing in the Y axis. The upper area S may be an area that is generally positioned higher when the user uses the electronic device 101.

According to various embodiments, the shielding member 500 may be disposed in a first area S1 of a first supporting member 372 (see FIG. 5). The first area S1 may be a portion of the upper area S of the first supporting member 372 shown in FIG. 6, and may be designed in a shape corresponding to one surface of the shielding member 500. For example, the first area S1 may include an opening 372a through which at least a portion of the protruding portion of the shielding member 500 may be passed. As another example, the first area S1 may include a corresponding adhesive surface 372b to allow a flat surface of the shielding member 500 to be disposed. The adhesive surface 372*b* may be formed to surround the opening 372*a* along the edge thereof. The adhesive surface 372*b* may be designed in a closed loop shape. However, the adhesive surface 372*b* of the first area S1 is not limited in shape to the illustrated structure but may be changed in design to a flat surface having the same height as the first supporting member 372.

According to various embodiments, the adhesive member 590 may be disposed between the first area S1 of the first supporting member 372 and the shielding member 500. For example, the adhesive member 590 is a component to allow at least a portion (e.g., a flat surface) of the shielding member 500 to be fixed (e.g., attached) to the first area S1, and may be designed in a shape (or a shape corresponding to the adhesive surface 372*b*) corresponding to the flat surface of the shielding member 500. According to an embodiment, the adhesive member 590 may include a waterproof material. For example, the adhesive member 590 may include a material having elasticity, such as foam, silicone, and urethane.

According to various embodiments, the shielding member 500 may be disposed between a component having magnetism and a display module (e.g., the display 330 of FIG. 4), thereby shielding the magnetic force generated from the component having magnetism from being transferred to the display module 330. A component having magnetism may include a component, such as an acoustic component and/or a camera module. The shielding member 500 may be fixed to the first area S1 of the first supporting member 372, and may include a flat surface (e.g., the first portion 510 of FIGS. 7 to 9) disposed on the adhesive surface 372*b* of the first area S1, and a protruding portion (e.g., the second portion 520 of FIGS. 7 to 9) formed to penetrate the opening 372*a* of the first area S1. A portion of the protruding portion may serve as an opening and conduit of the acoustic component.

Hereinafter, the structure of the shielding member 500 is described in detail.

Figure 7:
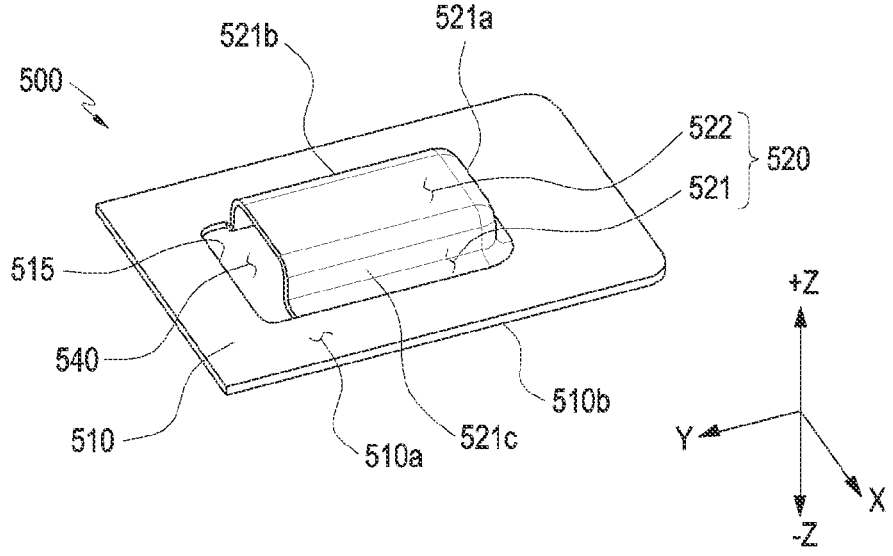
FIG. 7 is a perspective view illustrating a shielding member of an electronic device viewed in one direction according to one of various embodiments of the disclosure.

FIG. 7 is a perspective view illustrating a shielding member of an electronic device viewed in one direction according to one of various embodiments of the disclosure.

Figure 8:
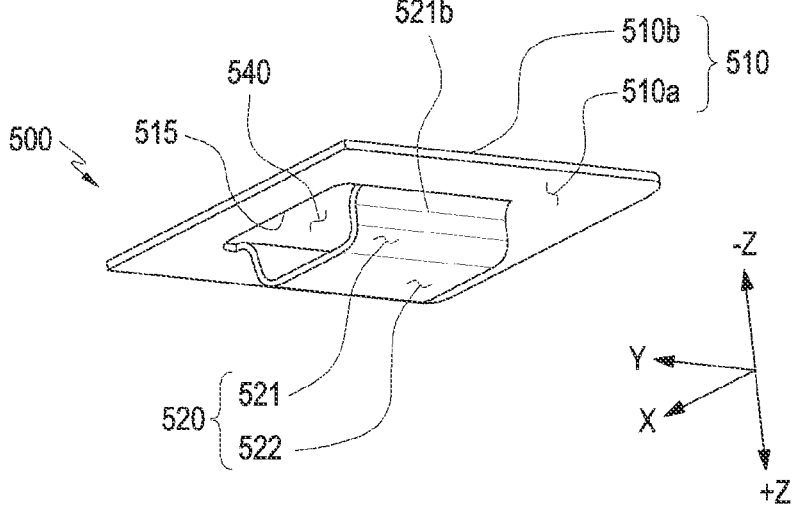
FIG. 8 is a perspective view illustrating a shielding member of an electronic device viewed in another direction according to one of various embodiments of the disclosure.

FIG. 8 is a perspective view illustrating a shielding member of an electronic device viewed in another direction according to one of various embodiments of the disclosure.

Figure 9:
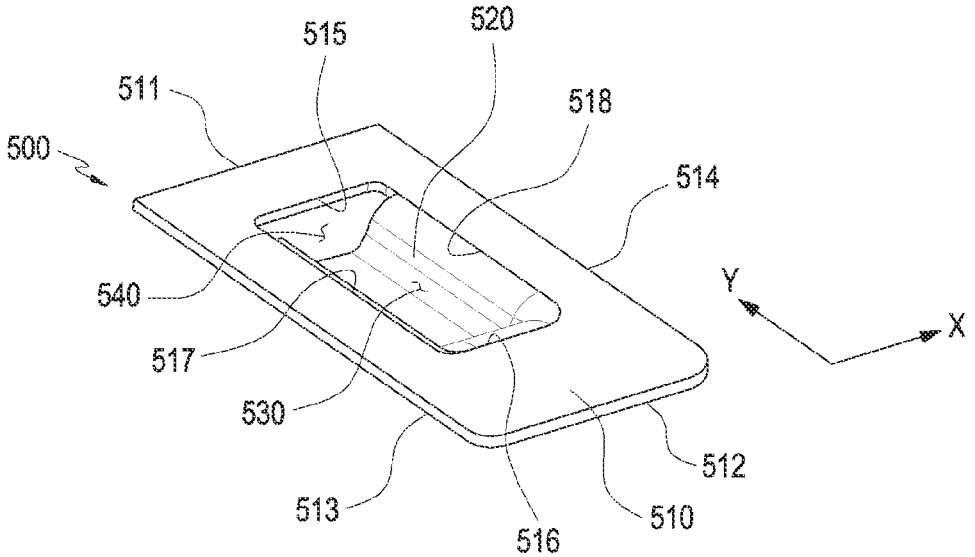
FIG. 9 is a perspective view illustrating a shielding member of an electronic device viewed in another direction according to one of various embodiments of the disclosure.

FIG. 9 is a perspective view illustrating a shielding member of an electronic device viewed in another direction according to one of various embodiments of the disclosure.

According to various embodiments, an electronic device (e.g., the electronic device 101 of FIGS. 1 to 4) may include a supporting bracket 370 (e.g., the supporting bracket 370 of FIGS. 5 and 6) and a shielding member 500 disposed in the supporting bracket 370.

The configuration of the shielding member 500 of FIGS. 7 and 8 may be identical in whole or part to the configuration of the shielding member 500 of FIGS. 5 and 6.

According to various embodiments, the shielding member 500 may be disposed between a display module (e.g., the display module 330 of FIG. 10) and an electrical component such as, for example, an acoustic component (e.g., the acoustic component 410 of FIG. 10) that generates a magnetic force. In one or more non-limiting embodiments, the shielding member 500 surrounds a magnetic material included with the electronic component. Accordingly, the shielding member 500 can shield the magnetic force produced by the electrical component from being directed toward the display module. According to an embodiment, at least a portion of the shielding member 500 may form a passage (e.g., an acoustic conduit) through which sound emitted from an acoustic component passes.

According to various embodiments, the shielding member 500 may include a first portion 510 and a second portion 520. In one or more non-limiting embodiments, the first portion and the second portion 520 are shaped differently from one another. According to an embodiment, the first portion 510 may have a flat plate shape and may include a first surface 510*a* facing in a first direction (+Z-axis direction) and a second surface 510*b* facing in a second direction (−Z-axis direction) opposite to the first direction (+Z-axis direction). The first surface 510*a* may be an area to be substantially adhered to a supporting bracket (e.g., the first area S1 of the first supporting member 372 of FIGS. 5 and 6), and the second surface 510*b* may be an area facing, disposed against, or coupled to the electrical component (e.g., an acoustic component). According to an embodiment, the second portion 520 may include a portion bending and extending from one side of the first portion 510. For example, the second portion 520 may include a 2-1th portion 521 bending in the first direction (+Z-axis direction) along the inside of the first portion 510 and a 2-2th portion 522 having a flat plate shape extending from the 2-1th portion 521. According to an embodiment, the 2-2th portion 522 may be disposed substantially in parallel to the first portion 510. When viewed from above the shielding member 500, the 2-2th portion 522 may be formed not to overlap the first portion 510.

According to various embodiments as shown in FIG. 9, for example, the first portion 510 of the shielding member 500 may have a rectangular plate shape, and may have a shape in which an inner central portion is opened. The first portion 510 may include a first outer edge 511 and a second outer edge 512 formed along the X-axis direction and parallel to each other, a third outer edge 513 formed along the Y-axis direction perpendicular to the X-axis direction and parallel to each other, and a fourth outer edge 514. According to an embodiment, the shielding member 500 may include a first opening 530 formed to be surrounded by the first portion 510, and the first opening 530 may be a rectangular opening corresponding to the first portion 510. For example, the first opening 530 may be formed to be surrounded by a first inner line 515 parallel to the first outer edge 511 of the first portion 510, a second inner line 516 parallel to the second outer edge 512, a third inner line 517 parallel to the third outer edge 513, and a fourth inner line 518 parallel to the fourth outer edge 514.

According to an embodiment, a space (e.g., the first conduit 461 of FIG. 10) formed by the first opening 530 and the second portion 520 may form an area of the conduit of the acoustic component. For example, the sound generated from the sound component may move outward through the space.

According to various embodiments, the second portion 520 of the shielding member 500 may include a 2-1th portion 521 extending from the inner lines of the first portion 510 and a 2-2th portion 522 having a flat plate shape extending from the 2-1th portion 521. The 2-1th portion 521 may have a bent shape and may include a first bending portion 521*a* extending from the second inner line 516, a second bending portion 521*b* extending from the third inner line 517, and a third bending portion 521*c* extending from the fourth inner line 518.

According to various embodiments, in the shielding member 500, the space between the first portion 510 and the 2-2th portion 522 may form the second opening 540. For example, the second opening 540 may be a space not extending from the first inner line 515 of the first portion 510 the 2-2th portion 522. As another example, the second opening 540 may be formed to be surrounded by the first inner line 515 of the first portion 510, the edge of the 2-2th portion 522, the edge of the second bending portion 521b, and the edge of the third bending portion 521c. As another example, a portion of the second inner line 516 of the first portion 510 and/or a portion of the second inner line 516 may be formed to surround at least a portion of the second opening 540. According to an embodiment, the second opening 540 may be connected to the first opening 530 and may form an area of the conduit of the acoustic component.

Figure 10:
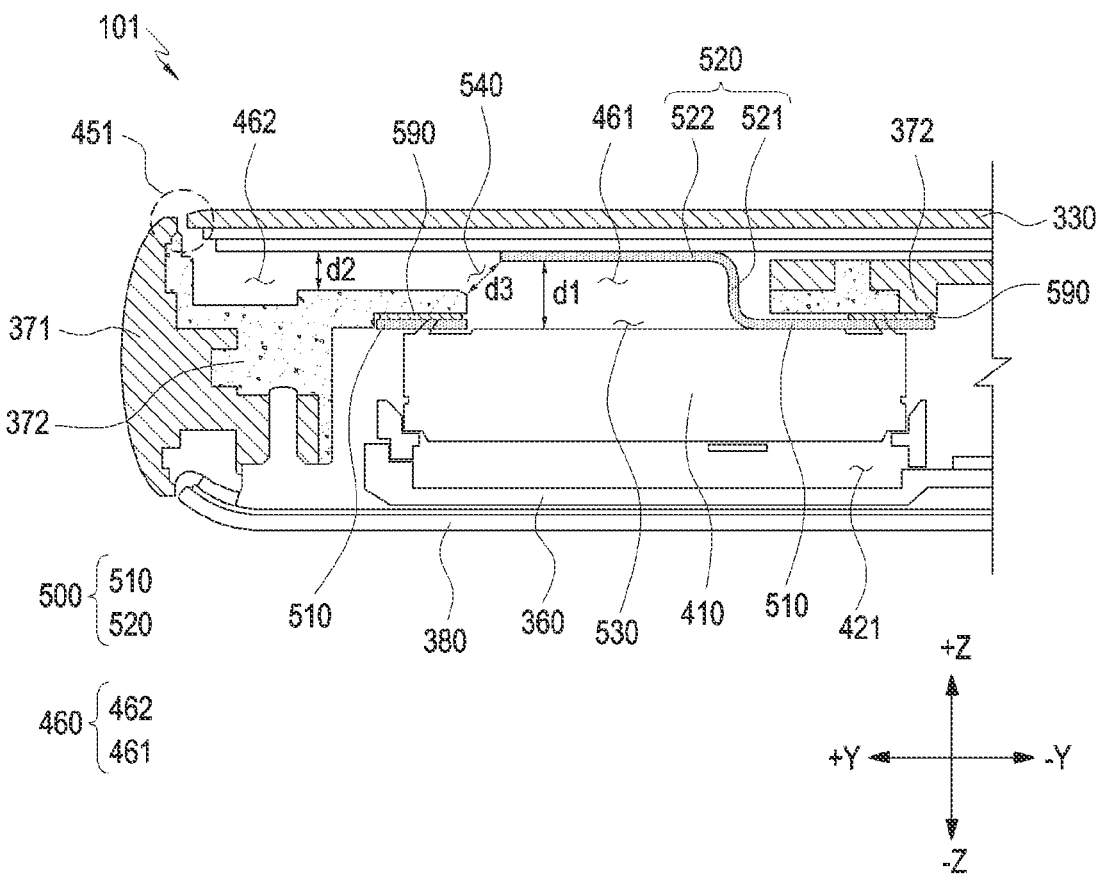
FIG. 10 is a cross-sectional view taken along an area where a speaker component, a shielding member, and a display module are disposed according to one of various embodiments of the disclosure.

FIG. 10 is a cross-sectional view taken along an area where a speaker component, a shielding member, and a display module are disposed according to one of various embodiments of the disclosure.

FIG. 10 is a view illustrating a cross section of the shielding member 500 of FIG. 6, taken along line A-A' and structures positioned around the shielding member 500.

According to various embodiments, an electronic device (e.g., the electronic device 101 of FIGS. 1 to 4) may include a display module 330, a supporting bracket 370 (e.g., the supporting bracket 370 of FIGS. 5 and 6), a rear structure 360 (e.g., the second supporting member 360 of FIG. 4) disposed in the electronic device 101, an electrical component 410, a shielding member 500, and an adhesive member 590. The supporting bracket 370 may include a side bezel structure 371 and a first supporting member 372.

The configuration of the supporting bracket 370, the shielding member 500, and the adhesive member 590 of FIG. 10 may be identical in whole or part to the configuration of the supporting bracket 370 of FIGS. 5 and 6 and the shielding member 500 and the adhesive member 590 of FIGS. 7 to 9.

According to various embodiments, the display module 330 may be disposed to face in the +Z-axis direction to visually transfer information to the outside (e.g., the user) of the electronic device 101. The display module 330 may include a display, a hologram device, or a projector and control circuitry to control a corresponding one of the display, hologram device, and projector. According to an embodiment, the display module 330 may be coupled with or disposed adjacent to a touch detection circuit, a pressure sensor capable of measuring the strength (pressure) of touches, and/or a digitizer for detecting a magnetic field-type stylus pen. In order to secure performance with the stylus pen and the digitizer, the shielding member 500 may be disposed on the rear surface (e.g., in the −Z-axis direction) of the display module 330 to prevent magnetic force generated from an internal component of the electronic device 101 from being directed to the display module 330.

According to various embodiments, the electrical component 410 includes an acoustic component 410 may be disposed in the electronic device 101. The acoustic component 410 may be a component in which a speaker structure and a receiver structure are integrated, and may be disposed adjacent to one end of the supporting bracket 370. For example, the acoustic component 410 may include a component formed to generate sound based on an electrical signal and/or a component formed to convert sound into an electrical signal. As another example, a plurality of acoustic components 410 may be manufactured, and may be disposed adjacent to an upper end portion and/or a lower end portion of the electronic device 101.

According to various embodiments, the electronic device 101 may include an acoustic enclosure that receives the acoustic component 410. The acoustic enclosure may provide a resonance space 421 for providing resonance of sound and at least a portion of a conduit for transferring vibrations generated by the acoustic component 410 to an external acoustic radiation hole 451 of the electronic device 101. For example, the acoustic enclosure may be formed as at least a portion of the first supporting member 372 and the rear structure 360 formed to surround the acoustic component 410. As another example, the acoustic enclosure may include a portion of the rear structure 360 formed to surround a surface of the acoustic component 410 facing in the −Z-axis direction, and a portion of the first supporting member 372 formed to surround at least a portion of a surface of the acoustic component 410 facing in the +Z-axis direction and a side surface perpendicular to the +Z-axis direction.

According to various embodiments, the shielding member 500 may be disposed between the display module 330 and the acoustic component 410, and may shield the magnetic force generated from the acoustic component 410 from being directed toward the display module 330 (e.g., the +Z-axis direction). The shielding member 500 may include a first portion 510 disposed adjacent to the acoustic component 410, and a second portion 520 bending and extending from one side of the first portion 510 and disposed adjacent to the display module 330. The second portion 520 of the shielding member 500 may include a 2-1th portion 521 extending from the inner lines of the first portion 510 and a 2-2th portion 522 having a flat plate shape extending from the 2-1th portion 521.

According to various embodiments, in the electronic device 101, the acoustic conduit 460 may be designed such that the sound generated from the acoustic component 410 faces the radiation hole 451 positioned at the upper end of the display module 330. The acoustic conduit 460 may include a first conduit 461 adjacent to the acoustic component 410 and a second conduit 462 extending from the first conduit 461 to the radiation hole 451. A boundary portion between the first conduit 461 and the second conduit 462 may have a through hole having different widths of the conduit. The through hole may be the second opening 540 of the shielding member 500.

According to an embodiment, the first conduit 461 of the acoustic conduit 460 may be formed to be surrounded by at least a portion of the shielding member 500 and the acoustic component 410. For example, the first conduit 461 may be formed by the 2-1th portion 521 and the 2-2th portion 522 of the shielding member 500 and a portion of one surface of the acoustic component 410 facing in the +Z axis. The first portion 510 of the shielding member 500 may be disposed in contact with another portion of the surface of the acoustic component 410 facing in the +Z axis, thereby limiting the sound generated from the acoustic component 410 to move in one direction.

According to an embodiment, one surface (e.g., a surface facing in the −Z axis) of the 2-2th portion 522 of the shielding member 500 may form a portion of the first conduit 461, and the other surface (e.g., a surface facing in the +Z axis) may be disposed in contact with the display module 330. The separation distance between the one surface of the 2-2th portion 522 and the acoustic component 410 may form a first width d1 of the first conduit 461.

According to an embodiment, the second conduit 462 of the acoustic conduit 460 may extend from the first conduit 461 and may be formed to be surrounded by at least a portion of the first supporting member 372 and a portion of the display module 330. For example, the second conduit 462 may extend in the upper end direction (e.g., the +Y-axis direction) of the display module 330 and may be formed up to the radiation hole 451 formed by the upper end portion of the display module 330 and the first supporting member 372 (or the side bezel structure 371). The separation distance between one surface of the first supporting member 372 facing in the +Z axis and the display module 330 may form a second width d2 of the second conduit 462. The second width d2 may have a different thickness depending on the position of the second conduit 462 due to the shape of the first supporting member 372.

According to an embodiment, the first conduit 461 and the second conduit 462 may be one passage formed to face the upper end portion side (e.g., the radiation hole 451) of the electronic device 101. The sound generated by the acoustic component 410 may be emitted to the outside by the radiation hole 451 after moving along the through hole of the first conduit 461 and the second conduit 462.

According to an embodiment, the width d3 of the conduit at the boundary (e.g., the through hole) between the first conduit 461 and the second conduit 462 may be determined by the position of an end portion of the 2-2th portion 522 of the shielding member 500 and the position of an end portion of the first supporting member 372. According to an embodiment, when viewed from above the display module 330, the end portion of the 2-2th portion 522 of the shielding member 500 and the end portion of the first supporting member 372 may not overlap each other. According to an embodiment, when viewed from above the display module 330, a portion of the end portion of the 2-2th portion 522 of the shielding member 500 may overlap the end portion of the first supporting member 372.

According to various embodiments, the first portion 510 of the shielding member 500 may be disposed between the acoustic component 410 and the first supporting member 372. As the adhesive member 590 is disposed on one surface (a surface facing in the +Z-axis) of the first portion 510, the first portion 510 may be fixed to the first supporting member 372. As the other surface (a surface facing in the −Z-axis) of the first portion 510 is connected to the acoustic component 410, the first portion 510 may be fixed to the first supporting member 372. The adhesive member 590 may block foreign matter and/or fluid introduced between the shielding member 500 and the first supporting member 372, thereby blocking a space other than the acoustic conduit 460 from the outside.

Figure 11:
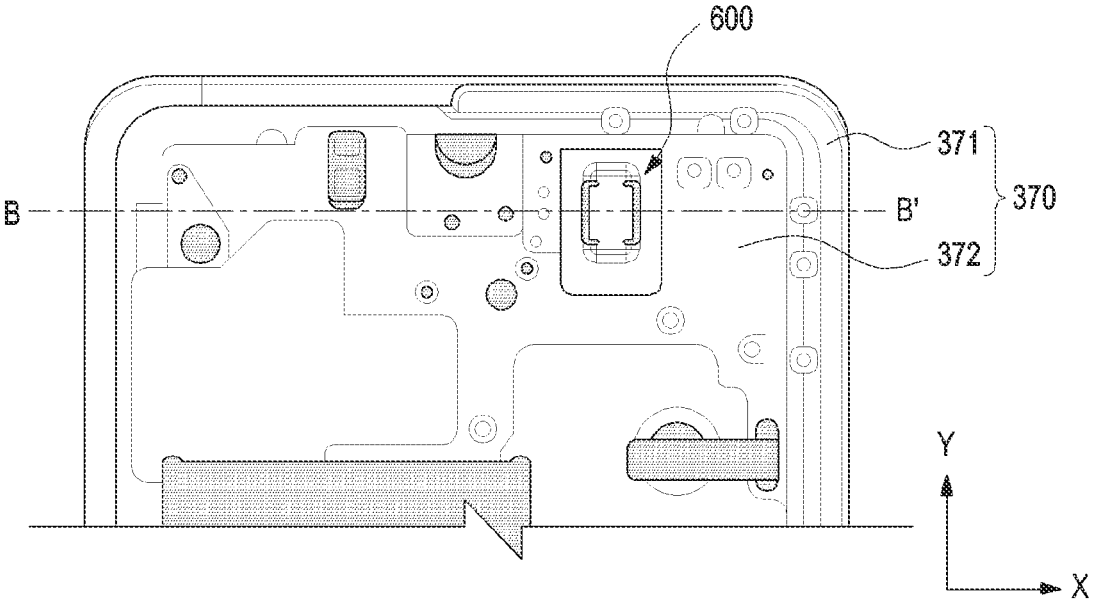
FIG. 11 is a front view illustrating a supporting bracket of an electronic device and a shielding member disposed on the supporting bracket according to another one of various embodiments of the disclosure.

FIG. 11 is a front view illustrating a supporting bracket of an electronic device and a shielding member disposed on the supporting bracket according to another one of various embodiments of the disclosure.

Figure 12:
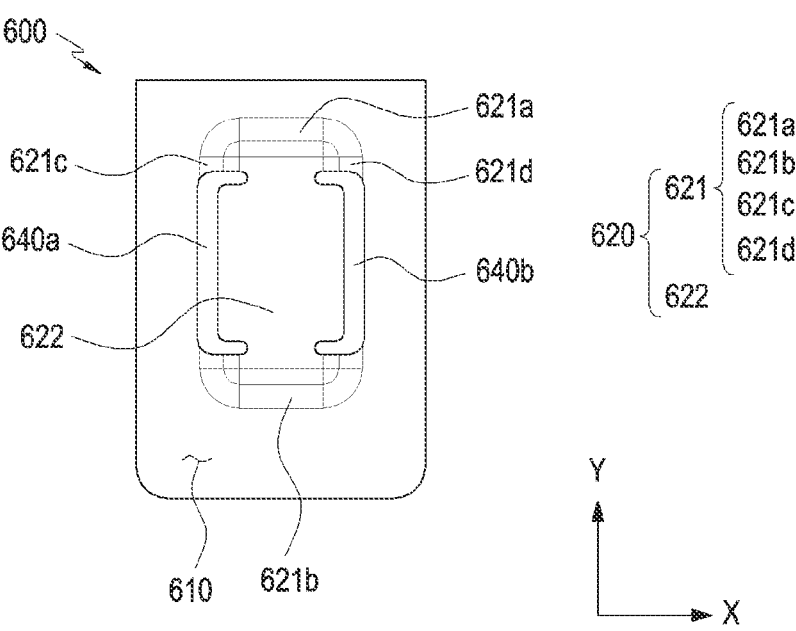
FIG. 12 is a perspective view illustrating a shielding member of an electronic device viewed in one direction according to another one of various embodiments of the disclosure.

FIG. 12 is a perspective view illustrating a shielding member of an electronic device viewed in one direction according to another one of various embodiments of the disclosure.

Figure 13:
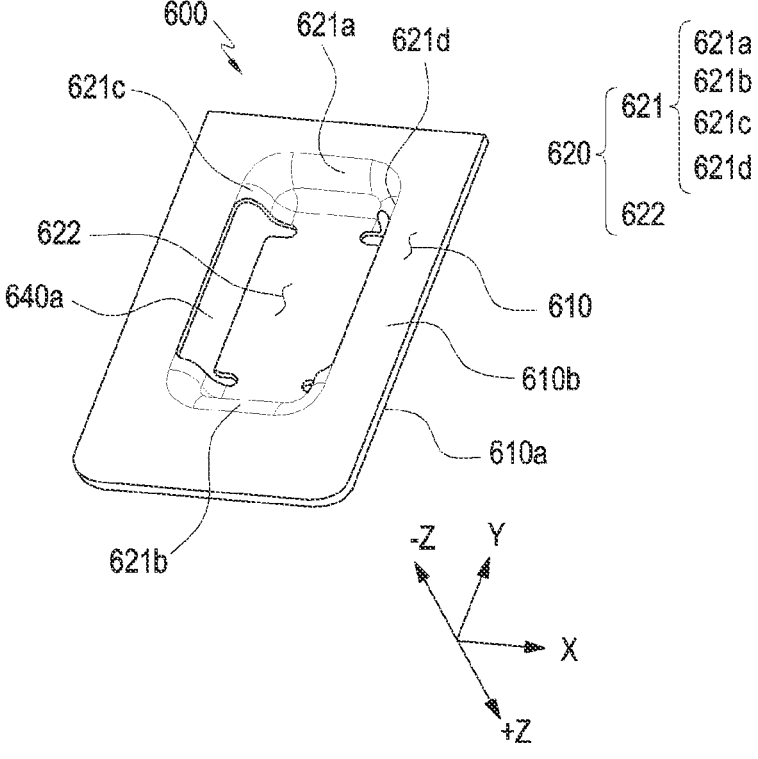
FIG. 13 is a perspective view illustrating a shielding member of an electronic device viewed in another direction according to another one of various embodiments of the disclosure.

FIG. 13 is a perspective view illustrating a shielding member of an electronic device viewed in another direction according to another one of various embodiments of the disclosure.

According to various embodiments, the electronic device (e.g., the electronic device 101 of FIGS. 1 to 4) may include a supporting bracket 370 and a shielding member 600 disposed in the supporting bracket 370. The supporting bracket 370 may include a side bezel structure 371 and a first supporting member 372.

The configuration of the supporting bracket 370 of FIG. 11 may be identical in whole or part to the configuration of the supporting bracket 370 of FIGS. 5 and 6.

According to various embodiments, the supporting bracket 370 may provide a space (or area) capable of receiving various components of the electronic device 101. In the upper area of the supporting bracket 370, components, such as a camera module (e.g., the camera module 312 of FIG. 3), an acoustic component (e.g., the sound output module 155 of FIG. 1), a circuit board (e.g., the printed circuit board 340 of FIG. 4), and a shielding member 600, may be disposed. At least some of the components may be disposed overlapping each other.

According to various embodiments, the shielding member 600 may be disposed in an area of a first supporting member 372. The area may be a portion of the upper area of the first supporting member 372 and be designed in a shape corresponding to one surface of the shielding member 600.

According to various embodiments, the shielding member 600 may be disposed between a display module (e.g., the display module 330 of FIG. 14) and a component (e.g., an acoustic component (e.g., the acoustic component 410 of FIG. 14)) that generates a magnetic force, and may shield the magnetic force from being directed toward the display module. According to an embodiment, at least a portion of the shielding member 600 may form a passage (e.g., an acoustic conduit) through which sound emitted from the acoustic component passes.

According to various embodiments, the shielding member 600 may include a first portion 610 and a second portion 620 having different shapes. According to an embodiment, the first portion 610 may have a flat plate shape and may include a first surface 610a facing in a first direction (+Z-axis direction) and a second surface 610b facing in a second direction (−Z-axis direction) opposite to the first direction (+Z-axis direction). The first surface 610a may be an area to be substantially adhered to the supporting bracket, and the second surface 610b may be an area facing or connected to the acoustic component.

According to an embodiment, the second portion 620 may include a portion bending and extending from one side of the first portion 610. For example, the second portion 620 may include a 2-1th portion 621 bending in the first direction (+Z-axis direction) along the inside of the first portion 610 and a 2-2th portion 622 having a flat plate shape extending from the 2-1th portion 621. According to an embodiment, the 2-2th portion 622 may be disposed substantially in parallel to the first portion 610. When viewed from above the shielding member 600, the 2-2th portion 622 may be disposed not to overlap the first portion 610.

According to various embodiments, the first portion 610 of the shielding member 600 may have a rectangular plate shape, and may have a shape in which an inner central portion is opened. According to another embodiment, the opened shape may be a recess shape that is integrally connected to the second portion 620 and is recessed in the +Z-axis direction throughout the shielding member 600.

According to an embodiment, a space (e.g., the first conduit 461 of FIG. 14) formed by the opened shape and the second portion 620 may form an area of the conduit of the acoustic component. For example, the sound generated from the sound component may move outward through the space.

According to various embodiments, the second portion 620 of the shielding member 600 may include a 2-1th portion 621 extending from the inner lines of the first portion 610 and a 2-2th portion 622 having a flat plate shape extending from the 2-1th portion 621. The 2-1th portion 621 may have a bent shape and may include a first bending portion 621a and a second bending portion 621b arranged side by side along the X-axis direction, and a third bending portion 621c and a fourth bending portion 621d arranged side by side along the Y-axis direction.

According to various embodiments, in the shielding member 600, partial areas of the third bending portion 621c and the fourth bending portion may form a first opening 640a and a second opening 640b, respectively. For example, the first opening 640a may be formed to be surrounded by the first portion 610, the 2-2th portion 622, and the third bending portion 621c of the 2-1th portion. As another example, the second opening 640b may be formed to be surrounded by the first portion 610, the 2-2th portion 622, and the fourth bending portion 621d of the 2-1th portion. Each of the first opening 640a and the second opening 640b may form an area of the conduit of the acoustic component. The acoustic component 410 may provide two acoustic paths facing in opposite directions.

Figure 14:
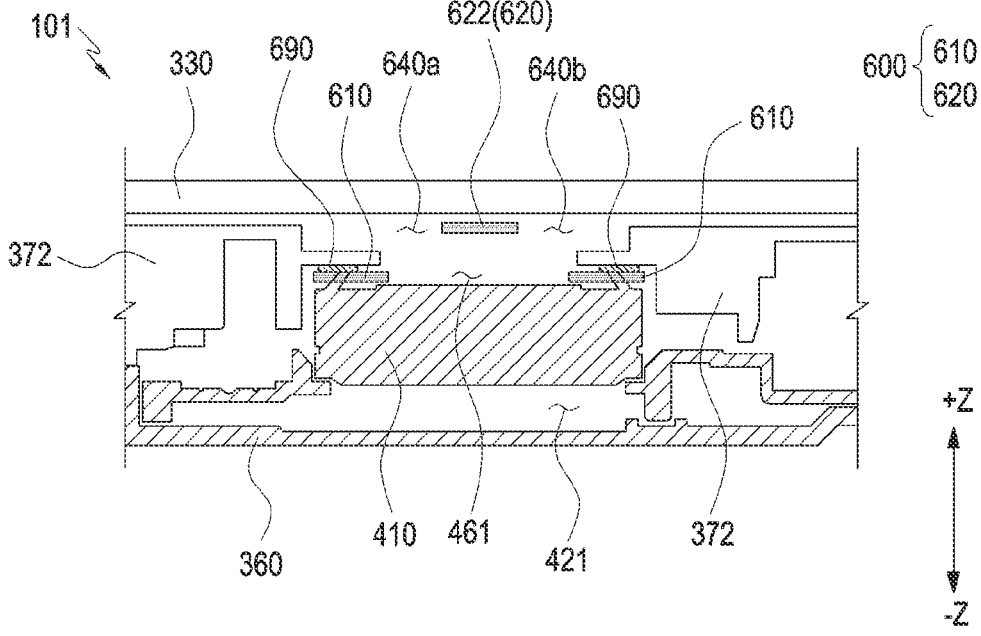
FIG. 14 is a cross-sectional view taken along an area where a speaker component, a shielding member, and a display module are disposed according to another one of various embodiments of the disclosure.

FIG. 14 is a cross-sectional view taken along an area where a speaker component, a shielding member, and a display module are disposed according to another one of various embodiments of the disclosure.

FIG. 14 is a view illustrating a cross section of the shielding member 600 of FIG. 11, taken along line B-B' and structures positioned around the shielding member 600.

According to various embodiments, an electronic device (e.g., the electronic device 101 of FIGS. 1 to 4) may include a display module 330, a supporting bracket 370 (e.g., the supporting bracket 370 of FIGS. 11 to 13), a rear structure 360 (e.g., the second supporting member 360 of FIG. 4) disposed in the electronic device 101, an electronic component 410, a shielding member 600, and an adhesive member 690. The supporting bracket 370 may include a side bezel structure 371 and a first supporting member 372.

The configuration of the supporting bracket 370 and the shielding member 600 of FIG. 14 may be identical in whole or part to the configuration of the supporting bracket 370 and the shielding member 600 of FIGS. 11 to 13.

According to various embodiments, the display module 330 may be disposed to face in the +Z-axis direction to visually transfer information to the outside (e.g., the user) of the electronic device 101. The display module 330 may include a display, a hologram device, or a projector and control circuitry to control a corresponding one of the display, hologram device, and projector. According to an embodiment, the display module 330 may be coupled with or disposed adjacent to a touch detection circuit, a pressure sensor capable of measuring the strength (pressure) of touches, and/or a digitizer for detecting a magnetic field-type stylus pen. In order to secure performance with the stylus pen and the digitizer, a shielding member 600 may be disposed on the rear surface (e.g., in the –Z-axis direction) of the display module 330 to prevent magnetic force generated from an internal component of the electronic device 101 from being directed to the display module 330.

According to various embodiments, the electronic component 410 includes an acoustic component 410, which may be disposed in the electronic device 101. The acoustic component 410 may be a component in which a speaker structure and a receiver structure are integrated, and may be disposed adjacent to one end of the supporting bracket (e.g., the first supporting member 372). For example, the acoustic component 410 may include a component formed to generate sound based on an electrical signal and/or a component formed to convert sound into an electrical signal. As another example, a plurality of acoustic components 410 may be manufactured, and may be disposed adjacent to an upper end portion and/or a lower end portion of the electronic device 101.

According to various embodiments, the electronic device 101 may include an acoustic enclosure that receives the acoustic component 410. The acoustic enclosure may provide a resonance space 421 for providing resonance of sound and at least a portion of a conduit for transferring vibrations generated by the acoustic component 410 to an external acoustic radiation hole (not shown) of the electronic device 101. For example, the acoustic enclosure may be formed as at least a portion of the first supporting member 372 and the rear structure 360 formed to surround the acoustic component 410. As another example, the acoustic enclosure may include a portion of the rear structure 360 formed to surround a surface of the acoustic component 410 facing in the –Z-axis direction, and a portion of the first supporting member 372 formed to surround at least a portion of a surface of the acoustic component 410 facing in the +Z-axis direction and a side surface perpendicular to the +Z-axis direction.

According to various embodiments, the shielding member 600 may be disposed between the display module 330 and the acoustic component 410, and may shield the magnetic force generated from the acoustic component 410 from being directed toward the display module 330 (e.g., the +Z-axis direction). The shielding member 600 may include a first portion 610 disposed adjacent to the acoustic component 410, and a second portion 620 bending and extending from one side of the first portion 610 and disposed adjacent to the display module 330. The second portion 620 of the shielding member 600 may include a 2-1th portion (e.g., the 2-1th portion 621 of FIGS. 12 and 13) extending from the inner lines of the first portion 610 and a 2-2th portion 622 having a flat plate shape extending from the 2-1th portion.

According to various embodiments, in the electronic device 101, the acoustic conduit (e.g., the first conduit 460) may be designed such that the sound generated from the acoustic component 410 faces the radiation hole (not shown) positioned at the upper end of the display module 330. At least a portion of the acoustic conduit may be formed to be surrounded by at least a portion of the shielding member 600 and the acoustic component 410. For example, at least a portion of the acoustic conduit 460 may be formed by a second portion (e.g., the 2-1th portion (e.g., the 2-1th portion 621 of FIGS. 12 and 13) or the 2-2th portion 622) of the shielding member 600 and a portion of one surface facing in the +Z direction of the acoustic component 410. The first portion 610 of the shielding member 600 may be disposed in contact with another portion of the surface of the acoustic component 410 facing in the +Z axis, thereby limiting the sound generated from the acoustic component 410 to move in one direction.

According to an embodiment, one surface (e.g., a surface facing in the –Z axis) of the 2-2th portion 622 of the shielding member 600 may form a portion of the acoustic conduit 460, and the other surface (e.g., a surface facing in the +Z axis) may be disposed adjacent to or in contact with the display module 330. The separation distance between the one surface of the 2-2th portion 622 and the acoustic component 410 may determine the width of the acoustic conduit.

According to various embodiments, the first portion 610 of the shielding member 600 may be disposed between the acoustic component 410 and the first supporting member 372. As the adhesive member 690 is disposed on one surface (a surface facing in the +Z-axis) of the first portion 610, the first portion 610 may be fixed to the first supporting member 372. As the other surface (a surface facing in the –Z-axis) of the first portion 610 is connected to the acoustic component 410, the first portion 610 may be fixed to the first supporting member 372. The adhesive member 690 may block foreign matter and/or fluid introduced between the shielding member 600 and the first supporting member 372, thereby blocking a space other than the acoustic conduit 460 from the outside.

According to various embodiments of the disclosure, an electronic device (e.g., the electronic device 101 of FIGS. 1 to 4) may comprise a housing (e.g., the housing 310 of FIGS. 2 and 3), a display module (e.g., the display module 330 of FIG. 10), an acoustic component (e.g., the acoustic component 410 of FIG. 10) disposed in the housing and including a magnetic material, and a shielding member (e.g., the shielding member 500 of FIG. 10) disposed between the display module and the acoustic component. The shielding member may include a first portion (e.g., the first portion 510 of FIG. 10) disposed adjacent to the acoustic component and a second portion (e.g., the second portion 520 of FIG. 10) bending and extending from a side of the first portion and disposed adjacent to the display module.

According to various embodiments, the shielding member may further includes a first opening (e.g., the first opening 530 of FIG. 10) formed to be surrounded by the first portion. The first opening may form a portion of an acoustic conduit of the acoustic component.

According to various embodiments, the shielding member may further include a second opening (e.g., the second opening 540 of FIG. 10) formed to be surrounded by the first portion and the second portion and forming a portion of an acoustic conduit of the acoustic component.

According to various embodiments, the electronic device may further comprise a supporting member (e.g., the first supporting member 372 of FIG. 10) disposed in the housing and providing a space for seating the acoustic component and an adhesive member (e.g., the adhesive member 590 of FIG. 10) for sealing between the first portion of the shielding member connected to the acoustic component and the supporting member.

According to various embodiments, a first area of the supporting member may have a shape corresponding to a surface of the shielding member. The first area may include an adhesive surface (e.g., the adhesive surface 372b of FIG. 5) to which a first portion of the shielding member is fixed and an opening (e.g., the opening 372a of FIG. 5) formed to pass at least a portion of the second portion of the shielding member.

According to various embodiments, a space surrounded by the acoustic component and the second portion of the shielding member may form at least a portion of an acoustic conduit, and the acoustic conduit may extend toward an edge of the display module.

According to various embodiments, the first portion and second portion of the shielding member may be integrally formed.

According to various embodiments, the second portion of the shielding member includes a 2-1th portion (e.g., the 2-1th portion 521 of FIG. 7) bending from inner lines of the first portion and a 2-2th portion (e.g., the 2-2th portion 522 of FIG. 7) having a flat plate shape extending from the 2-1th portion.

According to various embodiments, the first portion and the 2-2th portion of the shielding member may be disposed in parallel to each other without overlapping each other.

According to various embodiments, an acoustic conduit of the acoustic component may be formed so that a sound generated from the acoustic component is directed to a radiation hole positioned at an end of the display module.

The acoustic conduit may include a first conduit (e.g., the first conduit 461 of FIG. 10) adjacent to the acoustic component and forming a first width and a second conduit (e.g., the second conduit 462 of FIG. 10) extending from the first conduit to the radiation hole and forming a second width.

According to various embodiments, the electronic device may further comprise a supporting member disposed in the housing and providing a space for seating the acoustic component. The first conduit may be formed to be surrounded by at least a portion of the shielding member and the acoustic component. The second conduit may be formed to be surrounded by at least a portion of the supporting member and a portion of the display module.

According to various embodiments, the second portion of the shielding member may include a 2-1th portion bending from inner lines of the first portion and a 2-2th portion having a flat plate shape extending from the 2-1th portion. The first conduit may be determined by an inner space formed by the 2-1th portion and the 2-2th portion of the shielding member.

According to various embodiments, a conduit width at a boundary between the first width and the second width may be defined by a position of an end portion of the 2-2th portion of the shielding member and a position of an end portion of the supporting member.

According to various embodiments, the first width and the second width may be formed to have different sizes.

According to various embodiments, the adhesive member may be formed of a material having elasticity, such as foam, silicone, or urethane.

According to various embodiments of the disclosure, an electronic device (e.g., the electronic device 101 of FIGS. 1 to 4) may comprise a supporting bracket (e.g., the supporting bracket 370 of FIG. 10), a display module (e.g., the display module 330 of FIG. 10) including a digitizer, an acoustic component (e.g., the acoustic component 410 of FIG. 10) disposed in an area of the supporting bracket and including a magnetic material, and a shielding member (e.g., the shielding member 500 of FIG. 10) disposed between the display module and the acoustic component to shield a magnetic force toward the digitizer. The shielding member may include a first portion (e.g., the first portion 510 of FIG. 10) disposed adjacent to the acoustic component and a second portion (e.g., the second portion 520 of FIG. 10) bending and extending from a side of the first portion and disposed adjacent to the display module.

According to various embodiments, the electronic device may further comprise an adhesive member (e.g., the adhesive member 590 of FIG. 10) for sealing between the first portion of the shielding member connected to the acoustic component and the supporting bracket.

According to various embodiments, the shielding member may further include an opening formed to be surrounded by the first portion and the second portion and forming a portion of an acoustic conduit of the acoustic component.

According to various embodiments, when viewed from above the display module, the second portion of the shielding member and the supporting bracket may be spaced apart from each other without overlapping each other.

According to various embodiments, a first area of the supporting member may have a shape corresponding to a surface of the shielding member. The first area may include an adhesive surface for allowing a first portion of the shielding member to be fixed thereto and an opening formed to allow at least a portion of the second portion of the shielding member to pass therethrough.

According to various embodiments of the disclosure, the electronic device may comp comprise a housing including a front plate and an opposing rear plate, a supporting bracket supporting a display module between the front plate and the rear plate, an electronic component disposed between the supporting bracket and the rear plate, the electronic component including a magnetic material that produces a magnetic force, and a shielding member disposed on the supporting bracket, the shielding member surrounding the magnetic material of the electronic component and coupling the shielding member to the supporting bracket.

According to various embodiments, the electronic component may include an acoustic speaker.

According to various embodiments, the electronic device may further comprise an adhesive member disposed between the shielding member and the supporting bracket to establish a waterproof seal therebetween.

According to various embodiments, the shielding member may include a first flat plate disposed against the acoustic speaker and a second flat plate extending from the first flat plate and disposed against the display module.

According to various embodiments, a distance between the second flat plate and the acoustic speaker defines at least a portion of an acoustic conduit configured to direct sound output from the acoustic speaker.

It is apparent to one of ordinary skill in the art that the shielding member and the electronic device including the same according to various embodiments of the disclosure as described above are not limited to the above-described embodiments and those shown in the drawings, and various changes, modifications, or alterations may be made thereto without departing from the scope of the disclosure.

What is claimed is:

1. An electronic device, comprising:
a housing;
a display module;
an acoustic component disposed in the housing and including a magnetic material; and
a shielding member disposed between the display module and the acoustic component, wherein the shielding member includes:
a first portion disposed adjacent to the acoustic component and comprising a first opening defined by an inner side of the first portion;
a second portion including a (2-1)th portion bending and extending from a portion of the inner side of the first portion toward the display module and a (2-2)th portion extending from the (2-1)th portion to cover the first opening and spaced apart from the acoustic component toward the display module; and
a second opening defined between another portion of inner side of the first portion and an edge of the second portion
wherein the first opening and the second opening form a portion of an acoustic conduit of the acoustic component.

2. The electronic device of claim 1, further comprising:
a supporting member disposed in the housing and providing a space for seating the acoustic component; and
an adhesive member for sealing between the first portion of the shielding member connected to the acoustic component and the supporting member.

3. The electronic device of claim 2, wherein a first area of the supporting member has a shape corresponding to a surface of the shielding member, and
wherein the first area includes an adhesive surface to which the first portion of the shielding member is fixed and an opening formed to pass at least a portion of the second portion of the shielding member.

4. The electronic device of claim 1, wherein a space surrounded by the acoustic component and the second portion of the shielding member forms at least a portion of an acoustic conduit, and wherein the acoustic conduit extends toward an edge of the display module.

5. The electronic device of claim 1, wherein the first portion and the second portion of the shielding member are integrally formed.

6. The electronic device of claim 1, wherein the second portion of the shielding member includes a 2-1th portion bending from inner lines of the first portion and a 2-2th portion having a flat plate shape extending from the 2-1th portion.

7. The electronic device of claim 6, wherein the first portion and the 2-2th portion of the shielding member are disposed in parallel to each other without overlapping each other.

8. The electronic device of claim 1, wherein an acoustic conduit of the acoustic component is formed so that a sound generated from the acoustic component is directed to a radiation hole positioned at an end of the display module, and
wherein the acoustic conduit includes a first conduit adjacent to the acoustic component and forming a first width and a second conduit extending from the first conduit to the radiation hole and forming a second width.

9. The electronic device of claim 8, further comprising a supporting member disposed in the housing and providing a space for seating the acoustic component,
wherein the first conduit is formed to be surrounded by at least a portion of the shielding member and the acoustic component, and
wherein the second conduit is formed to be surrounded by at least a portion of the supporting member and a portion of the display module.

10. The electronic device of claim 9, wherein the second portion of the shielding member includes a 2-1th portion bending from inner lines of the first portion and a 2-2th portion having a flat plate shape extending from the 2-1th portion, and
wherein the first conduit is defined by an inner space formed by the 2-1th portion and the 2-2th portion of the shielding member.

11. The electronic device of claim 10, wherein a conduit width at a boundary between the first width and the second width is defined by a position of an end portion of the 2-2th portion of the shielding member and a position of an end portion of the supporting member.

12. The electronic device of claim 8, wherein the first width and the second width are formed to have different sizes.

13. The electronic device of claim 12, wherein the adhesive member includes a material containing elasticity such as foam, silicon, and urethane.

14. An electronic device, comprising:
a supporting bracket;
a display module including a digitizer;
an acoustic component disposed in an area of the supporting bracket and including a magnetic material; and
a shielding member disposed between the display module and the acoustic component to shield a magnetic force toward the digitizer, wherein the shielding member includes:

a first portion disposed adjacent to the acoustic component and comprising a first opening defined by an inner side of the first portion;

a second portion including a (2-1)th portion bending and extending from a portion of the inner side of the first portion toward the display module and a (2-2)th portion extending from the (2-1)th portion to cover the first opening and spaced apart from the acoustic component toward the display module; and a second opening defined between another portion of inner side of the first portion and an edge of the second portion wherein the first opening and the second opening form a portion of an acoustic conduit of the acoustic component.

15. The electronic device of claim 14, further comprising an adhesive member for sealing between the first portion of the shielding member connected to the acoustic component and the supporting bracket.

16. The electronic device of claim 14, wherein when viewed from above the display module, the second portion of the shielding member and the supporting bracket are spaced apart from each other without overlapping each other.

17. The electronic device of claim 14, wherein a first area of the supporting member has a shape corresponding to a surface of the shielding member, and wherein the first area includes an adhesive surface to which the first portion of the shielding member is fixed and an opening formed to pass at least a portion of the second portion of the shielding member.

\*    \*    \*    \*    \*